US012787618B2

(12) United States Patent
Shin et al.

(10) Patent No.: US 12,787,618 B2
(45) Date of Patent: Nov. 3, 2026

(54) DISPLAY DEVICE AND MANUFACTURING METHOD THEREOF

(71) Applicant: SAMSUNG DISPLAY CO., LTD., Yongin-si (KR)

(72) Inventors: Hyun Eok Shin, Yongin-si (KR); Ju Hyun Lee, Yongin-si (KR); Yu-Gwang Jeong, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 505 days.

(21) Appl. No.: 18/471,621

(22) Filed: Sep. 21, 2023

(65) Prior Publication Data

US 2024/0206298 A1 Jun. 20, 2024

(30) Foreign Application Priority Data

Dec. 19, 2022 (KR) ........................ 10-2022-0178425

(51) Int. Cl.

| | |
|---|---|
| ***H10K 59/80*** | (2023.01) |
| ***H10K 59/12*** | (2023.01) |
| ***H10K 59/40*** | (2023.01) |

(52) U.S. Cl.

CPC ..... *H10K 59/8792* (2023.02); *H10K 59/1201* (2023.02); *H10K 59/40* (2023.02)

(58) Field of Classification Search

CPC . H10K 59/8792; H10K 59/1201; H10K 59/40

See application file for complete search history.

(56) References Cited

U.S. PATENT DOCUMENTS

| | | | | |
|---|---|---|---|---|
| 7,709,838 | B2 | 5/2010 | Huh et al. | |
| 10,725,333 | B2 * | 7/2020 | Kim | G02F 1/136286 |
| 2014/0312339 | A1 * | 10/2014 | Fujita | H10K 59/35 257/40 |
| 2019/0214440 | A1 * | 7/2019 | Lee | H10K 59/122 |
| 2020/0043983 | A1 * | 2/2020 | Kim | H10K 59/38 |
| 2020/0258944 | A1 * | 8/2020 | Joo | H10K 59/38 |
| 2021/0384271 | A1 * | 12/2021 | Ahn | H10K 71/70 |
| 2022/0231200 | A1 * | 7/2022 | Kim | H10K 59/38 |

(Continued)

FOREIGN PATENT DOCUMENTS

| | | |
|---|---|---|
| JP | 5681668 | 3/2015 |
| KR | 10-2019-0033546 | 3/2019 |

(Continued)

*Primary Examiner* — Mary Ellen Bowman

(74) *Attorney, Agent, or Firm* — F. CHAU & ASSOCIATES, LLC

(57) ABSTRACT

The present disclosure relates to a display device, and the display device includes: a substrate; a light-emitting element disposed on the substrate and including an emission layer; and a light controller disposed on the light-emitting element, in which the light controller includes: a plurality of light blocking parts extending in a first direction and spaced apart along a second direction crossing the first direction; and a transparent organic layer disposed between the plurality of light blocking parts, each of the plurality of light blocking parts includes at least one light absorption layer and at least one compensation layer alternately stacked along a thickness direction of the substrate, and the at least one light absorption layer has a compressive stress and the at least one compensation layer has a tensile stress.

20 Claims, 13 Drawing Sheets

(56) References Cited

U.S. PATENT DOCUMENTS

| | | | | |
|---|---|---|---|---|
| 2022/0238606 | A1* | 7/2022 | Jeong | H10K 59/38 |
| 2023/0217794 | A1 | 7/2023 | Kim et al. | |
| 2023/0263008 | A1* | 8/2023 | Lee | H10K 71/00 257/91 |
| 2024/0097086 | A1* | 3/2024 | Woo | H10K 59/875 |
| 2024/0341141 | A1* | 10/2024 | Bang | H10K 59/126 |

FOREIGN PATENT DOCUMENTS

| | | |
|---|---|---|
| KR | 10-2022-0109548 | 8/2022 |
| KR | 10-2023-0104506 | 7/2023 |

* cited by examiner

DISPLAY DEVICE AND MANUFACTURING METHOD THEREOF

CROSS-REFERENCE TO RELATED APPLICATION

This application claims priority under 35 U.S.C. § 119 to Korean Patent Application No. 10-2022-0178425, filed on Dec. 19, 2022, in the Korean Intellectual Property Office, the entire contents of which are herein incorporated by reference.

TECHNICAL FIELD

The present disclosure relates to a display device and a manufacturing method thereof, and more particularly, to a display device including a light controller and a manufacturing method thereof.

DISCUSSION OF RELATED ART

Display devices for displaying images include, for example, a liquid crystal display (LCD), an organic light emitting diode (OLED) display, a quantum dot light emitting diode (QLED) display, a micro LED display, and the like.

These display devices are used in various electronic devices such as, for example, smartphones, mobile phones, tablet PCs, monitors, televisions, multimedia players, video game consoles, and the like. The display device may also be used in various fields other than electronic devices.

To limit a viewing angle of a personal electronic device for privacy purposes, or to limit light directed from a vehicle display device to a windshield for driver safety, a light control film (LCF) may be disposed on a display surface of the display device to block the displayed image being viewed by a viewer from beyond a certain viewing angle.

SUMMARY

Embodiments of the present disclosure are for enhancing light absorption efficiency by providing a light controller including a light blocking part.

Embodiments of the present disclosure are intended to provide an effective manufacturing method of a display device by simplifying a manufacturing process of a light controller.

Embodiments of the present disclosure are for limiting a lateral viewing angle so that a user's privacy is not exposed. In addition, this is to prevent light emitted from a display device used in a vehicle from interfering with a view of a driver by being reflected on the windshield of the vehicle.

A display device according to an embodiment of the present disclosure includes: a substrate; a light-emitting element disposed on the substrate and including an emission layer; and a light controller disposed on the light-emitting element, in which the light controller includes a plurality of light blocking parts extending in a first direction and spaced apart along a second direction crossing the first direction; and a transparent organic layer disposed between the plurality of light blocking parts, each of the plurality of light blocking parts includes at least one light absorption layer and at least one compensation layer alternately stacked along a thickness direction of the substrate, and the at least one light absorption layer has a compressive stress and the at least one compensation layer has a tensile stress.

The at least one light absorption layer may be formed of a molybdenum-tantalum oxide, and the at least one compensation layer may be formed of molybdenum.

A number of the light absorption layers may be greater than a number of the compensation layers.

At least one of an uppermost layer or a lowermost layer of each of the light blocking parts may be one light absorption layer of the at least one light absorption layer.

The at least one light absorption layer may include about 2 at % to about 15 at % of tantalum.

A total thickness of the at least one light absorption layer may be more than twice that of the at least one compensation layer.

A ratio of the total thickness of the at least one light absorption layer and the total thickness of the at least one compensation layer may be about 2:1 to 4:1.

A total thickness of the at least one compensation layer may be less than or equal to (a total thickness of the at least one light absorption layer)*(a stress of the at least one light absorption layer/a stress of the at least one compensation layer).

A touch sensor layer disposed between the light-emitting element and the light controller and including a touch electrode may be further included.

The at least one light absorption layer may be two or more light absorption layers, and at least one of the two or more light absorption layers may have a thickness different from that of an other one of the two or more light absorption layers.

A manufacturing method of a display device according to an embodiment of the present disclosure includes: forming a light-emitting element on a substrate; forming an encapsulation layer covering the light-emitting element; forming a light blocking material layer by alternately stacking a light absorption layer for absorbing light and a compensation layer for compensating for a stress of the light absorption layer on the encapsulation layer; forming light blocking parts by dry etching the light blocking material layer; and coating a transparent organic layer filling between the light blocking parts.

The light absorption layer may have a compressive stress, and the compensation layer may have a tensile stress.

The light absorption layer may be formed of a molybdenum-tantalum oxide, and the compensation layer may be formed of molybdenum.

At least one of an uppermost layer or a lowermost layer of each of the light blocking parts may be the light absorption layer.

The light absorption layer may include about 2 at % to about 15 at % of tantalum.

A thickness of the light absorption layer may be twice or more than that of the compensation layer.

A ratio of the thickness of the light absorption layer and the thickness of the compensation layer may be about 2:1 to 4:1.

A thickness of the compensation layer may be less than or equal to (a thickness of the light absorption layer)*(the stress of the light absorption layer/a stress of the compensation layer).

The manufacturing method of the display device according to an embodiment of the present disclosure may further include, after the forming of the encapsulation layer, forming a touch sensor layer including a touch electrode on the encapsulation layer.

The manufacturing method of the display device according to an embodiment of the present disclosure may further include, after the forming of the light blocking material layer, forming a hard mask pattern on the light blocking material layer.

According to an embodiment of the present disclosure, the display device and the manufacturing method including the light controller with enhanced light efficiency may be provided. In addition, the light controller according to the embodiment may include the compensation layer that compensates for the stress of the light absorption layer, thereby reducing the stress applied to the entire substrate. According to the embodiments, the manufacturing process of the light controller may be simplified by forming the light blocking part without using an organic film barrier rib structure.

According to an embodiment of the present disclosure, the display device that protects a user's privacy by limiting a lateral viewing angle may be provided. In addition, the light emitted from the display device used in the vehicle is not provided to the windshield of the vehicle so that the light is not reflected from the windshield of the vehicle and does not interfere with the driver's view.

BRIEF DESCRIPTION OF THE DRAWINGS

The above and other objects and features of the present disclosure will become apparent by describing in detail embodiments thereof with reference to the accompanying drawings, in which.

Figure 1:
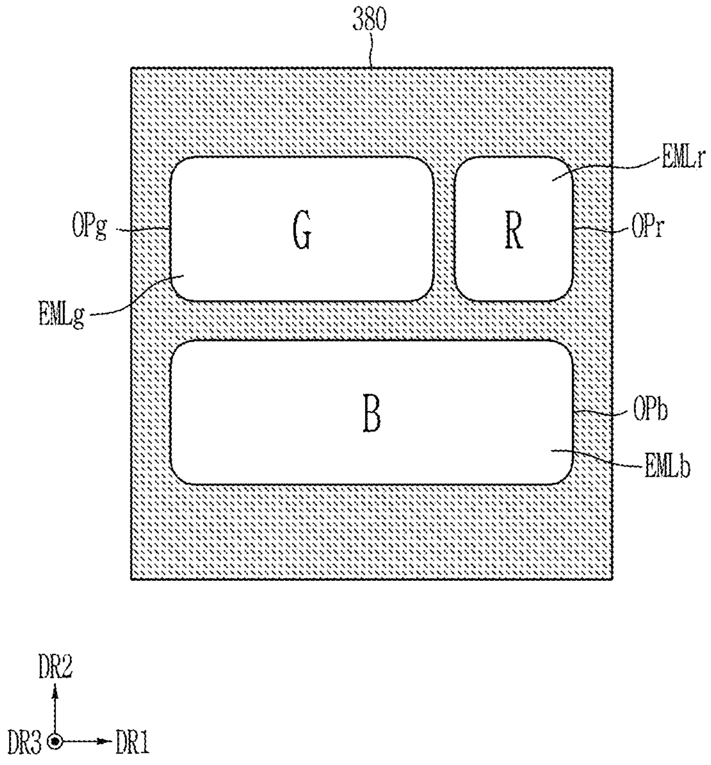
FIG. 1 is a top plan view schematically showing pixels of a display device according to an embodiment of the present disclosure.

Since the drawings in FIGS. 1-13 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

The present disclosure will be described more fully hereinafter with reference to the accompanying drawings, in which embodiments of the present disclosure are shown. As those skilled in the art would realize, the described embodiments may be modified in various different ways, all without departing from the spirit or scope of the present disclosure.

To clarify the present disclosure, parts that are not connected with the description will be omitted, and the same elements or equivalents are referred to by the same reference numerals or characters throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means disposed on or below the object portion, and does not necessarily mean disposed on the upper side of the object portion based on a gravitational direction. These relative terms are intended to encompass different orientations of the device in use or operation, in addition to the orientation depicted in the drawings.

In addition, unless explicitly described to the contrary, the word "comprise", and variations such as "comprises" or "comprising", will be understood to imply the inclusion of stated elements but not the exclusion of any other elements.

When the term "about" is used in this specification in connection with a numerical value, it is intended that the associated numerical value includes a tolerance of up to ±10% around the stated numerical value.

Further, in the specification, the phrase "on a plane" means when an object portion is viewed from above, and the phrase "on a cross-section" means when a cross-section taken by vertically cutting an object portion is viewed from the side.

Although the terms "first", "second", and the like are used to describe various constituent elements, these constituent elements are not limited by these terms. These terms are used only to distinguish one constituent element from another constituent element. Therefore, the first constituent elements described below may be the second constituent elements without departing from the spirit or scope of the present disclosure.

The display device may display an image toward a third direction DR3 on a plane defined by a first direction DR1 and a second direction DR2. The front (or a top) and back (or a bottom) surfaces of each member are distinguished by the third direction DR3. The directions indicated by the first to third directions DR1, DR2, and DR3 are relative concepts and may be converted to other directions.

A display device including a light controller according to an embodiment of the present disclosure is described with reference to FIG. 1 to FIG. 4.

Figure 2:
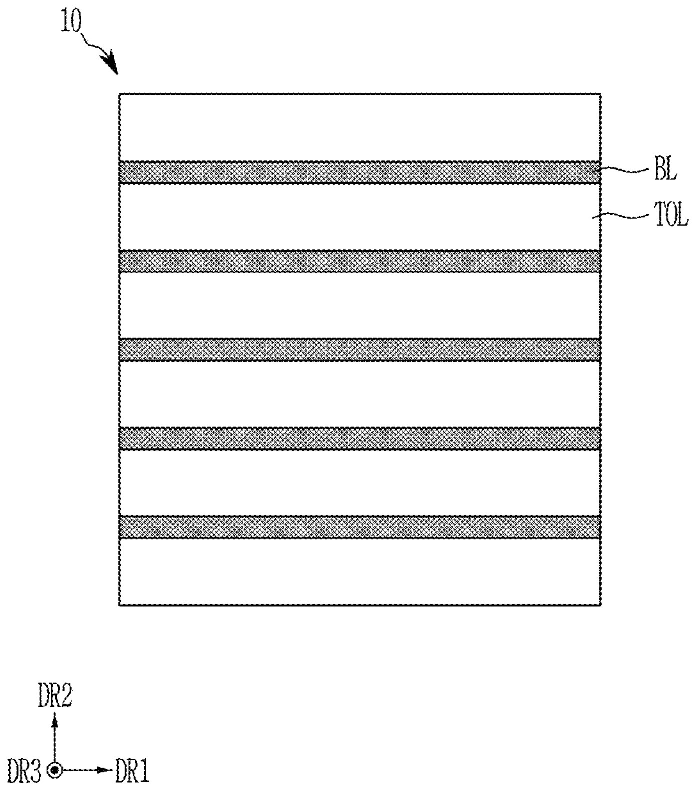
FIG. 2 is a top plan view of a light controller formed on a display device according to an embodiment of the present disclosure.
Figure 3:
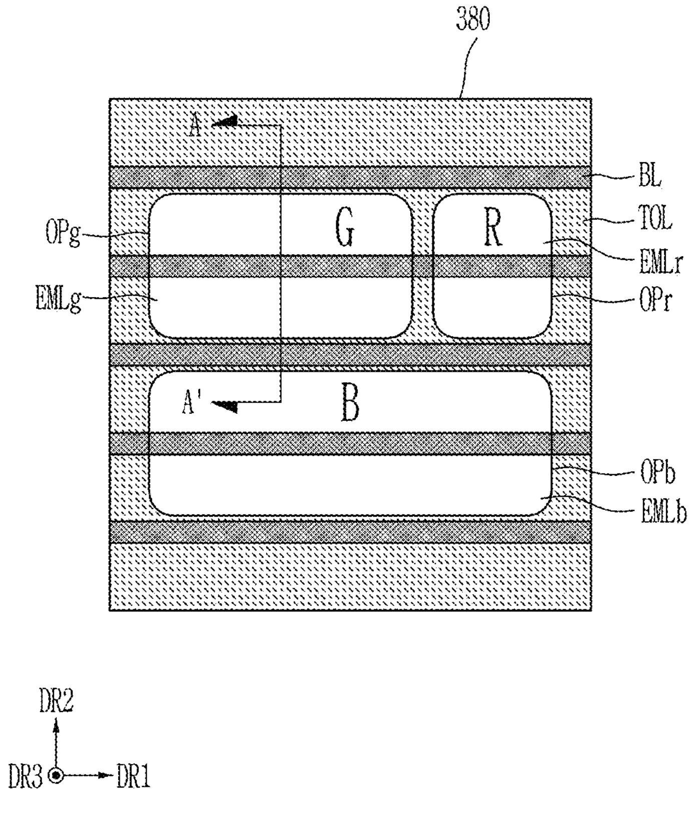
FIG. 3 is a view showing a flat structure schematically showing a display device that FIG. 1 and FIG. 2 are combined.
Figure 4:
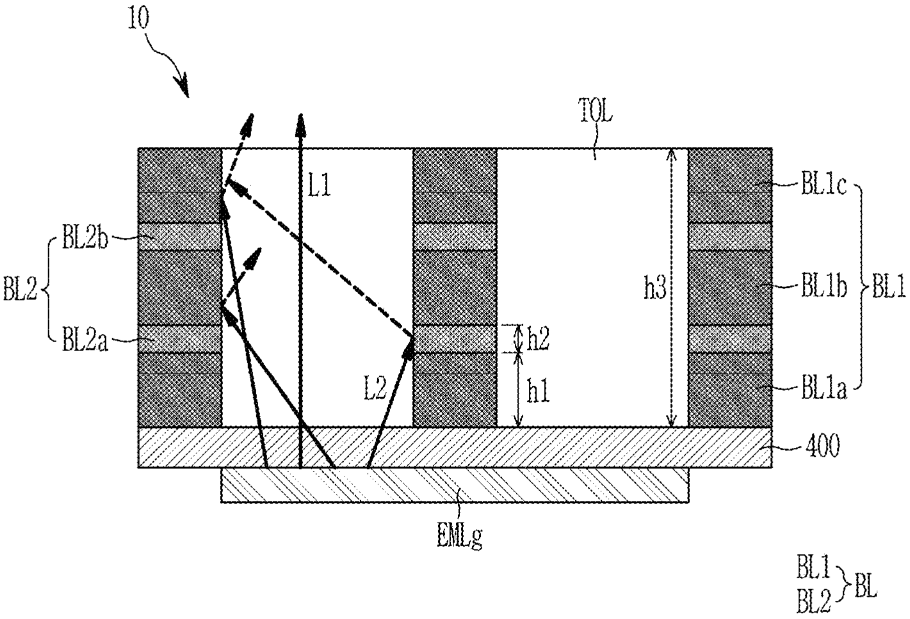
FIG. 4 is a schematic cross-sectional view of a display device according to an embodiment of the present disclosure taken along line A-A' of FIG. 3.

FIG. 1 is a top plan view schematically showing pixels of a display device according to an embodiment of the present disclosure, FIG. 2 is a top plan view of a light controller formed on a display device according to an embodiment of the present disclosure, FIG. 3 is a view showing a flat structure schematically showing a display device of which FIG. 1 and FIG. 2 are combined, and FIG. 4 is a schematic cross-sectional view of a display device according to an embodiment of the present disclosure taken along line A-A' of FIG. 3.

In FIG. 1, three light-emitting elements representing different colors red (R), green (G), and blue (B) disposed adjacently are briefly shown, and each light-emitting element includes one of the emission layers EMLr, EMLg, and EMLb.

Figure 10:
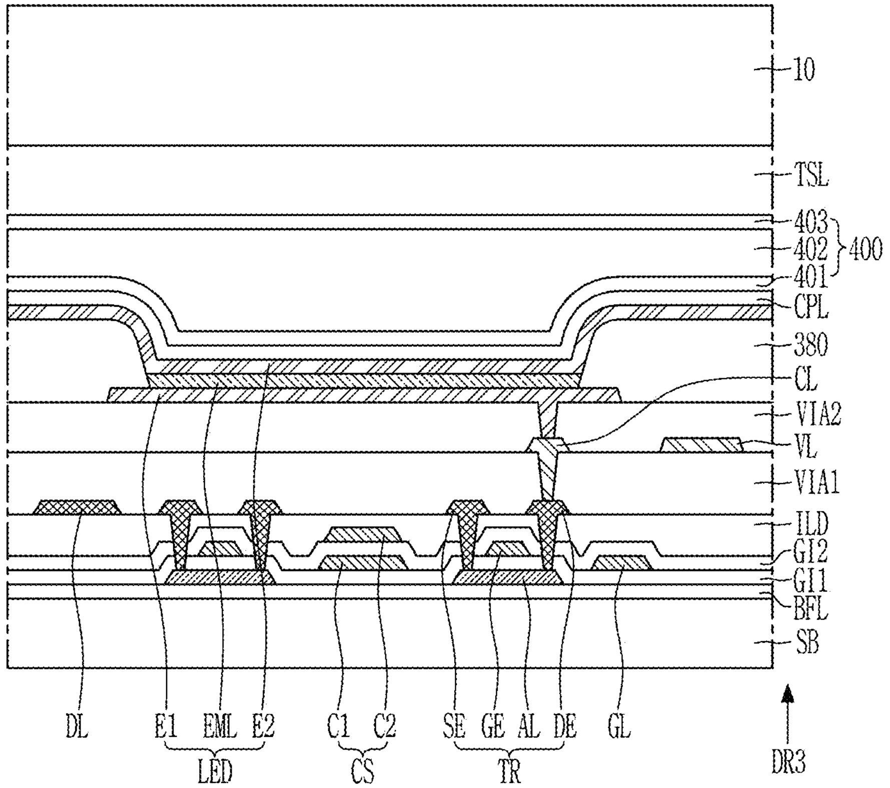
FIG. 10 is a cross-sectional view of a display panel according to an embodiment of the present disclosure.

Each emission layer EMLr, EMLg, or EMLb is a part that emits light in a light-emitting element, and is partitioned by a pixel definition layer 380 (see FIG. 10). Each emission layer EMLr, EMLg, or EMLb may overlap an opening OPr, OPg, or OPb formed in the pixel definition layer 380. Each emission layer EMLr, EMLg, or EMLb may be disposed within each opening OPr, OPg, or OPb of the pixel definition layer 380, and may include a portion disposed outside each opening OPr, OPg, or OPb. For example, the light-emitting element representing color R may include the emission layer EMLr, and the emission layer EMLr may be disposed in the opening Opr. The light-emitting element representing color G may include the emission layer EMLg, and the emission layer EMLg may be disposed in the opening Opg. The light-emitting element representing color B may include the emission layer EMLb, and the emission layer EMLb may be disposed in the opening Opb. A first electrode (an anode) may be disposed under each of the emission layers EMLr, EMLg, and EMLb, and a second electrode (a cathode) and an encapsulation layer may be disposed on the pixel definition layer 380 and the emission layers EMLr, EMLg, and EMLb. One anode, one emission layer EMLr, EMLg, or EMLb, and one cathode may constitute one light-emitting element. The detailed laminated structure of the light-emitting element is described later through FIG. 10.

FIG. 2 shows a planar structure of the light controller 10 according to an embodiment of the present disclosure.

The light controller 10 may include a plurality of light blocking parts BL. The light blocking parts BL may limit a user's viewing angle for image light by including a light blocking material.

The light blocking parts BL according to an embodiment of the present disclosure may extend in the first direction DR1, and may be disposed at a regular interval along the second direction DR2 crossing the first direction DR1. According to an embodiment of the present disclosure, the arrangement interval of the light blocking parts BL may not be constant.

The light blocking part BL may include a light absorption layer including a light blocking material. For example, the light blocking material may include a dark color pigment such as a black pigment or a gray pigment, or a dark color dye. Alternatively, low-reflection metals such as, for example, molybdenum (Mo) or tungsten (W), metal oxides, and dark color polymers may be used. The metal oxide may include, for example, molybdenum tantalum oxide ($MoTa_xO_y$), copper oxide ($CuO_x$), aluminum oxide ($AlO_x$), chromium oxide ($CrO_x$), molybdenum oxide ($MoO_x$), titanium oxide ($TiO_x$), aluminum neodymium oxide ($AlNd_xO_y$), copper molybdenum oxide ($CuMo_xO_y$), molybdenum titanium oxide ($MoTi_xO_y$), or the like.

A transparent organic layer TOL is disposed in a region in which the plurality of light blocking parts BL is not formed. The transparent organic layer TOL may transmit and emit light incident from the light-emitting element to the outside, and may include a transparent resin. For example, the transparent organic layer TOL may include organic materials such as, for example, a general-purpose polymer such as poly(methyl methacrylate) (PMMA) or polystyrene (PS), a polymer derivative having a phenolic group, an acryl-based polymer, imide-based polymers, a polyimide (PI), siloxane-based polymers, and cardo-based polymers.

The light controller 10 according to an embodiment of the present disclosure may include a plurality of light blocking parts BL, which extend in the first direction DR1 on a plane and are disposed at regular intervals along the second direction DR2 intersecting the first direction DR1, and a transparent organic layer TOL filling between the light blocking parts BL. The light controller 10 may be disposed on the display panel including the light-emitting element as shown in FIG. 1.

FIG. 3 is a planar structure according to an embodiment of the present disclosure, in which the light controller as shown in FIG. 2 is disposed on the light-emitting element having the arrangement as shown in FIG. 1.

In the embodiment of FIG. 3, a structure in which one light blocking part BL crosses and overlaps the light-emitting elements representing colors G and R, and one light blocking part BL crosses and overlaps the light-emitting element representing color B is shown. Also, in the structure, one light blocking part BL is disposed between the adjacent light-emitting elements (e.g., between B and G, and between B and R), and two light blocking parts BL are respectively disposed on both sides (e.g., one side adjacent to R and G but away from B, and one side adjacent to B but away from G and R) of the light-emitting elements representing colors G, R and B.

In an embodiment of the present disclosure, each emission layer EMLr, EMLg, or EMLb and/or the opening OPr, OPg, or OPb of the pixel definition layer 380 overlaps one light blocking part BL, and one light blocking part BL is disposed on the center of each emission layer EMLr, EMLg, or EMLb and/or the opening OPr, OPg, or OPb of the pixel definition layer 380. For example, one light blocking part BL is disposed to cross the center of the emission layer EMLg (or opening OPg) and the center of the emission layer EMLr (or opening OPr), and one light blocking part BL is disposed to cross the center of the emission layer EMLb (or opening OPb). Each emission layer EMLr, EMLg, or EMLb and/or the opening OPr, OPg, or OPb of the pixel definition layer 380 may have a pair of light blocking parts BL that do not overlap and are disposed to be adjacent, and the pair of light blocking parts BL may be disposed to overlap the pixel definition layer 380. For example, one light blocking part BL may be disposed to be adjacent to the emission layers EMLr, EMLg, and EMLb (or openings OPr, OPg, or OPb) and not to be overlapped by the emission layers EMLr, EMLg, and EMLb (or openings OPr, OPg, or OPb), and may be interposed between the emission layer EMLr (or opening OPr) and the emission layer EMLb (or opening OPb), and between the emission layer EMLg (or opening OPg) and the emission layer EMLb (or opening OPb).

FIG. 4 is a cross-sectional view taken along line A-A' of FIG. 3.

Referring to FIG. 4, an encapsulation layer 400 may be disposed under the light blocking part BL, and the light-emitting element including the emission layer EMLg may be disposed on the encapsulation layer 400. The encapsulation layer 400 may include at least one inorganic layer and at least one organic layer, and may have a three-layer structure including a lower inorganic encapsulation layer, an organic encapsulation layer, and an upper inorganic encapsulation layer according to an embodiment of the present disclosure. The encapsulation layer 400 may be for protecting the emission layer from moisture or oxygen that may inflow from the outside. For example, the lower and upper inorganic encapsulation layers may protect the emission layer from moisture and oxygen, and the organic encapsulation layer may protect the emission layer from a foreign substance such as dust particles. The light-emitting element may be disposed under the encapsulation layer 400. The entire stacked structure of the display panel including the light-emitting element is described in FIG. 10.

FIG. 4 only simply shows the emission layer EMLg under the encapsulation layer 400, and hereinafter, the principle of the transmission and blocking of light based on the green emission layer EMLg will be described. In an embodiment of the present disclosure, the light controller 10 may include the plurality of light blocking parts BL and the transparent organic layer TOL on the encapsulation layer 400. The transparent organic layer TOL may be formed by a method of filling the gap between a plurality of light blocking parts BL.

According to an embodiment of the present disclosure, a touch sensor layer including a touch insulating layer and a plurality of touch electrodes may be disposed between the light controller 10 and the encapsulation layer 400 to sense a touch.

Referring to FIG. 4, the principle of the transmission and blocking of light based on the green emission layer EMLg is explained. To emit light by the light-emitting element is to emit light from the emission layer EMLg, and the light emitted from the emission layer EMLg may be emitted in various directions. In FIG. 4, for example, the path of light L1 and L2 emitted from the emission layer EMLg is shown using arrows, and the light that is absorbed by the light blocking part BL and does not proceed any further is indicated by a dotted line. As such, some light L1 emitted from the emission layer EMLg passes through the transparent organic layer TOL and is transmitted to the outside, and some light L2 is absorbed by the light blocking part BL disposed above the emission layer EMLg to not be transmitted beyond a certain angle. For example, at normal incidence or within the certain angle, the light emitted from the emission layer EMLg may be transmitted to the outside through the transparent organic layer TOL without being blocked by the light blocking parts BL.

The light blocking part BL according to an embodiment of the present disclosure may be formed by alternating the light absorption layer BL1 and the compensation layer BL2 multiple times along the thickness direction DR3 of the substrate. In an embodiment of the present disclosure, the light absorption layer BL1 may be disposed on the lowermost layer and/or the uppermost layer of the light blocking part BL. For example, by disposing the light absorption layer BL1 on the lowermost layer of the light blocking part BL, the light generated from the emission layer EMLg may be first absorbed to increase the light efficiency effect and reduce the lateral reflectance. In addition, by disposing the light absorption layer BL1 at the uppermost layer of the light blocking part BL, it is possible to increase the blocking rate of light transmitted to the outside. For example, the light absorption layers BL1 and the compensation layers BL2 may be arranged in such a way that the absorption of light incident on the side surfaces of the light blocking parts BL is optimized.

The number of the light absorption layers BL1 may be greater than the number of the compensation layers BL2. For example, the light blocking part BL may be a five-layered structure in which a first light absorption layer BL1*a*, a first compensation layer BL2*a*, a second light absorption layer BL1*b*, a second compensation layer BL2*b*, and a third light absorption layer BL1*c* are sequentially formed.

In an embodiment of the present disclosure, the first light absorption layer BL1*a*, the second light absorption layer BL1*b*, and the third light absorption layer BL1*c* may all be formed with the same thickness h1. In this case, the entire thickness of the light absorption layer BL1 constituting the light blocking part BL may be a value obtained by multiplying the thickness h1 of each light absorption layer by the number of the light absorption layers BL1. For example, in the five-layered structure shown in FIG. 4, the number of the light absorption layers BL1 is three, and thus, the entire thickness of the light absorption layer BL1 constituting the light blocking part BL may be 3h1. According to an embodiment of the present disclosure, at least one thickness of the first light absorption layer BL1*a*, the second light absorption layer BL1*b*, or the third light absorption layer BL1*c* may be formed differently.

In an embodiment of the present disclosure, both the first compensation layer BL2*a* and the second compensation layer BL2*b* may be formed with the same thickness h2. In this case, the entire thickness of the compensation layer BL2 constituting the light blocking part BL may be a value obtained by multiplying the thickness h2 of each compensation layer by the number of the compensation layers BL2. For example, in the five-layered structure shown in FIG. 4, the number of the compensation layers BL2 is two, and thus, the entire thickness of the compensation layer BL2 constituting the light blocking part BL may be 2h2. According to an embodiment of the present disclosure, the thickness of at least one of the first compensation layer BL2*a* or the second compensation layer BL2*b* may be formed differently. Each thickness of the compensation layer BL2 is related to relieving the stress of the light absorption layer BL1.

A plurality of thin film layers may be formed on the substrate. In each thin film layer, a stress inherent in the material and a stress generated in the thin film formation process may remain, and if the magnitude thereof exceeds a certain level, problems may occur in the process, and deformation or damage of the substrate may occur. There are two types of stress: tensile and compressive. The main difference between tensile stress and compressive stress is that tensile stress results in elongation whereas compressive stress results in shortening.

Since the stress of a plurality of thin film layers disposed on the substrate is proportional to the thickness of each thin film, the stress increases as the thickness of the light absorption layer BL1 with a certain stress increases, and the deformation or damage of the substrate may accordingly occur. Therefore, the stress of the light absorption layer BL1 may be alleviated by using the compensation layer BL2 having a stress opposite to that of the light absorption layer BL1. For example, when the light absorption layer BL1 has a compressive stress, the compensation layer BL2 may have a tensile stress.

The entire stress of each thin film disposed on the substrate may be proportional to the thickness of the thin film and the stress value of the material. For example, the magnitude of the force applied to the substrate may be calculated based on the thickness of each layer disposed on the substrate and the stress value of the material. That is, when the light absorption layer BL1 having a predetermined stress is formed with a predetermined thickness, the compensation layer BL2 with the predetermined thickness may be formed on the light absorption layer BL1 to offset the stress applied to the light absorption layer BL1. The compensation layer BL2 has a stress opposite to that of the light absorption layer BL1, and the thickness of the compensation layer BL2 to offset the stress value of the light absorption layer BL1 may be determined by Equation 1 below.

A thickness of a compensation layer=(a thickness of a light absorption layer)*(a stress value of a light absorption layer)/(a stress value of a compensation layer) [Equation 1]

In Equation 1 above, the stress value is in absolute value. In other words, for a compressive stress, it does not have a negative value. Also, if the light absorption layer or the compensation layer has more than one layer, the thickness is the total thickness of all the layers. As above-described, using Equation 1, the thickness of the compensation layer BL2 may be determined to offset the stress value of the light absorption layer BL1. According to an embodiment of the present disclosure, the thickness of the compensation layer BL2 may be smaller than the thickness of the compensation layer BL2 determined by Equation 1. That is, the entire stress may be relieved by compensating for the stress existing in the light absorption layer BL1 by using the compensation layer BL2 having an opposite property to that of the light absorption layer BL1 without offsetting the entire stress of the light absorption layer BL1. Accordingly, in an embodiment of the present disclosure, the thickness of the compensation layer BL2 may be smaller than or equal to the thickness of the compensation layer BL2 determined by Equation 1.

The entire stress of the light blocking part BL may be relieved by adjusting the process conditions and/or the thickness of the compensation layer BL2 so as to relieve the stress value of the light absorption layer BL1. For example, when a molybdenum-tantalum oxide (MTO) is used as the light absorption layer BL1, the stress present in the molybdenum-tantalum oxide (MTO) may be compensated by controlling the process conditions of the molybdenum (Mo) layer or by adjusting the thickness of the molybdenum (Mo) layer. Depending on the process conditions for forming the thin film, the stress value present in the thin film may vary. A detailed description of the stress range of the material will be described later along with FIG. 9.

In an embodiment of the present disclosure, the light absorption layer BL1 may have a compressive stress with a negative (−) stress, and the compensation layer BL2 may have a tensile stress with a positive (+) stress. Therefore, the stress of the light absorption layer BL1 may be alleviated, due to the compensation layer BL2 has a tensile stress which is opposite to the compressive stress of the light absorption layer BL1.

In an embodiment of the present disclosure, the light blocking part BL may have a structure in which molybdenum-tantalum oxide (MTO) and molybdenum (Mo) are alternately stacked a plurality of times. Molybdenum-tantalum oxide (MTO) may absorb light as a blackening layer. Molybdenum (Mo) is a low-reflection metal with low reflectance and may absorb some light.

Molybdenum-tantalum oxide (MTO) and molybdenum (Mo) may have different types of stress. For example, when the stress of the molybdenum-tantalum oxide (MTO) is about −350 MPa (the compressive stress) and the stress of the molybdenum layer is about +700 MPa (the tensile stress), the total thickness ratio of the molybdenum-tantalum oxide (MTO) layer and the molybdenum (Mo) layer for the stress relief of the light blocking part BL may be about 2:1 to 4:1. For example, based on Equation 1, a thickness of the molybdenum (Mo) layer=(the thickness of the molybdenum-tantalum oxide (MTO) layer)*350/700, the total thickness ratio of the molybdenum-tantalum oxide (MTO) layer and the molybdenum (Mo) layer may be calculated as follows: (the thickness of the molybdenum-tantalum oxide (MTO) layer)/(the thickness of the molybdenum (Mo) layer) =700/350=2/1. As described above, since the thickness of the compensation layer BL2 may be smaller than or equal to the thickness of the compensation layer BL2 determined by Equation 1, the total thickness ratio of the molybdenum-tantalum oxide (MTO) layer and the molybdenum (Mo) layer for the stress relief of the light blocking part BL may be about 2:1 to 4:1.

In the five-stacked structure of MTO/Mo/MTO/Mo/MTO, the thickness of each layer may be 0.8 μm/0.6 μm/0.8 μm/0.6 μm/0.8 μm. At this time, the ratio of the total thickness (2.4 μm) of the molybdenum-tantalum oxide (MTO) layer and the total thickness (1.2 μm) of the molybdenum (Mo) layer is 2:1, which may offset the stress formed in the thin film. Also, in the seven-stacked structure of MTO/Mo/MTO/Mo/MTO/Mo/MTO, the thickness of each layer may be 0.8 μm/0.6 μm/0.8 μm/0.5 μm/0.8 μm/0.5 μm/0.8 μm. At this time, the ratio of the total thickness (3.2 μm) of the molybdenum-tantalum oxide (MTO) layer and the total thickness (1.6 μm) of the molybdenum (Mo) layer is 2:1, which may offset the stress formed in the thin film.

In the five-stacked structure of MTO/Mo/MTO/Mo/MTO, the thickness of each layer may be formed as 0.8 μm/0.3 μm/0.8 μm/0.3 μm/0.8 μm. At this time, the ratio of the total thickness (2.4 μm) of the molybdenum-tantalum oxide (MTO) layer to the total thickness (0.6 μm) of the molybdenum (Mo) layer is 4:1, and the stress present in the molybdenum-tantalum oxide (MTO) layer may be relieved to some extent by using the molybdenum (Mo) layer. For example, if the stress is relieved to an extent not sufficient to overcome the strength of the object that is under stress, the object under stress may not deform or break. Strength is how much stress can be applied to a material before it goes into plastic deformation or fractures. For example, when the ratio of the total thickness of the molybdenum-tantalum oxide (MTO) layer to the total thickness of the molybdenum (Mo) layer is in a range from about 2:1 to 4:1, the stress present in the molybdenum-tantalum oxide (MTO) layer may not exceed a level to cause deformation or damage to the substrate. In an embodiment of the present disclosure, the total thickness of the light absorption layer(s) BL1 (e.g., molybdenum-tantalum oxide (MTO) layer) may be twice or more than that of the compensation layer(s) BL2 (e.g., molybdenum (Mo) layer). In this way, the molybdenum-tantalum oxide (MTO) layer and the molybdenum (Mo) layer may be alternately stacked a plurality of times, and the number and thickness of the stack may be variously applied for each embodiment.

In this way, as a plurality of compensation layers BL2 compensate for the stress of a plurality of light absorption layers BL1 and are alternately formed, the total thickness h3 of the light blocking part BL may be formed to be, for example, about 2.0 μm or more. In addition, the entire stress applied to the thin film may be relieved by compensating the molybdenum-tantalum oxide (MTO) layer having the compressive stress with the molybdenum (Mo) layer having the tensile stress, thereby preventing deformation or breakage of the substrate.

Since molybdenum-tantalum oxide (MTO) and molybdenum (Mo) include molybdenum (Mo) as a main component, they may be etched together using the same etching process. For example, molybdenum-tantalum oxide (MTO) and molybdenum (Mo) may be simultaneously dry-etched using a fluorine (F)-based gas.

In an embodiment of the present disclosure, the molybdenum-tantalum oxide (MTO) may include about 2 at % to about 15 at % tantalum (Ta). When tantalum (Ta) in an amount of less than 2 at % is included in the molybdenum-tantalum oxide (MTO), the process stability is lowered due to a solubility problem in water, and when the content of tantalum (Ta) exceeds 15 at %, the composition ratio of molybdenum-oxide ($MoO_2$) exhibiting a light absorption characteristic is relatively low, so the absorption light characteristic may be insufficient. In addition, as the content of tantalum (Ta) included in molybdenum-tantalum oxide (MTO) increases, a material cost may increase, and a difference in an etching degree between the molybdenum-tantalum oxide (MTO) and molybdenum (Mo) may occur.

A manufacturing method of the light controller 10 according to an embodiment of the present disclosure is described through FIG. 5 to FIG. 8. FIG. 5 to FIG. 8 are views sequentially showing a manufacturing method for forming a light controller 10 of a display device according to an embodiment of the present disclosure.

FIG. 5 to FIG. 8 only show an encapsulation layer 400 among layers disposed under the light controller.

Figure 5:
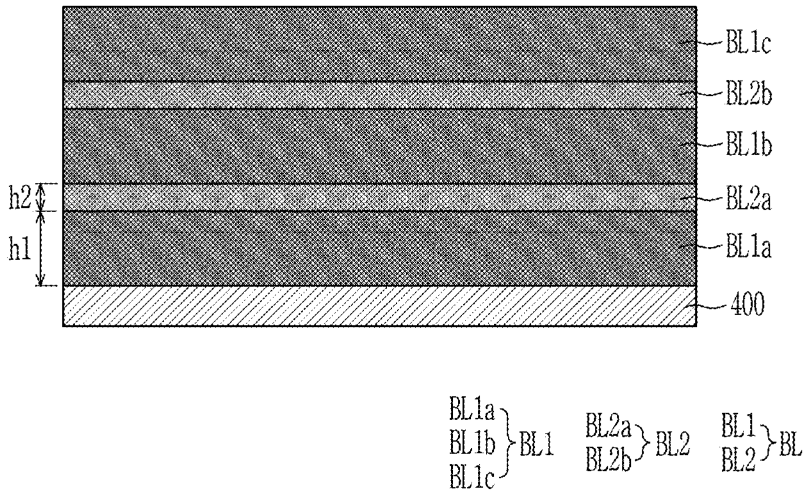
FIG. 5 to FIG. 8 are views sequentially showing a manufacturing method for forming a light controller of FIG. 4 according to an embodiment of the present disclosure.

Referring to FIG. 5, a light blocking material layer is formed by alternately stacking a light absorption layer BL1 and a compensation layer BL2 on an encapsulation layer 400. The light absorption layer BL1 and the compensation layer BL2 may have a structure that is repeatedly stacked by a plurality of times, and may be formed as a three-time repeated stacked structure, for example. The lowermost and uppermost layers of the light blocking part BL may be disposed with the light absorption layer BL1. For example, the light blocking part BL may be a five-layered structure.

First, a first light absorption layer BL1*a* is formed on the encapsulation layer 400. A first compensation layer BL2*a* is formed on the first light absorption layer BL1*a*. Then, a second light absorption layer BL1*b*, a second compensation layer BL2*b*, and a third light absorption layer BL1*c* are sequentially formed on the first compensation layer BL2*a*. For example, the light absorption layer BL1 and the compensation layer BL2 may be formed by a sputtering process. The sputtering process for the compensation layer BL2 may be performed at a low pressure so as to have a tensile stress.

The light absorption layer BL1 may be formed of a material capable of blocking light, and may include, for example, a molybdenum-tantalum oxide ($MoTa_xO_y$, MTO). The light absorption layer BL1 may be formed with a predetermined thickness h1.

The compensation layer BL2 may be formed of a low-reflection metal having low reflectance, and may include, for example, molybdenum (Mo). For example, the compensation layer BL2 may be formed of molybdenum (Mo) metal, and the light absorption layer BL1 may be formed of a molybdenum-tantalum oxide (MTO). In other words, the material of the compensation layer BL2 is molybdenum (Mo), and the material of light absorption layer BL1 is a molybdenum-tantalum oxide (MTO). The compensation layer BL2 may be formed with a predetermined thickness h2.

The thickness h1 of the light absorption layer BL1 may be greater than the thickness h2 of the compensation layer BL2. In an embodiment of the present disclosure, each layer of the light absorbing layers BL1 may have the same thickness h1. In addition, the thickness h2 of each layer of the compensation layers BL2 may be formed identically. For example, the thickness h1 of the light absorption layer BL1 may be about 0.8 μm, the thickness h2 of the compensation layer BL2 may be about 0.3 μm, and the entire thickness h3 of the light blocking part may be formed to be about 3.0 μm.

The light absorption layer BL1 and the compensation layer BL2 have different stress types, and based on a stress absolute value, the thicknesses of the light absorption layer BL1 and the compensation layer BL2 may be formed differently to compensate for the stress applied on the substrate. For example, the light absorption layer BL1 may have the compressive stress, while the compensation layer BL2 may have a different stress such as the tensile stress. For example, the total thickness of the light absorption layer BL1 and the total thickness h2 of the compensation layer BL2 may be formed at a ratio of about 2:1 to 4:1.

Next, the light absorption layer BL1 and the compensation layer BL2 may be patterned using a photolithography process. The patterning process may include a dry etching process such as, for example, a reactive ion etching (RIE) process. The light absorption layer BL1 and the compensation layer BL2 may be etched simultaneously in one process. For example, the light absorption layer BL1 and the compensation layer BL2 may be etched together using the same gas (e.g., a fluorine-series gas).

Figure 6:
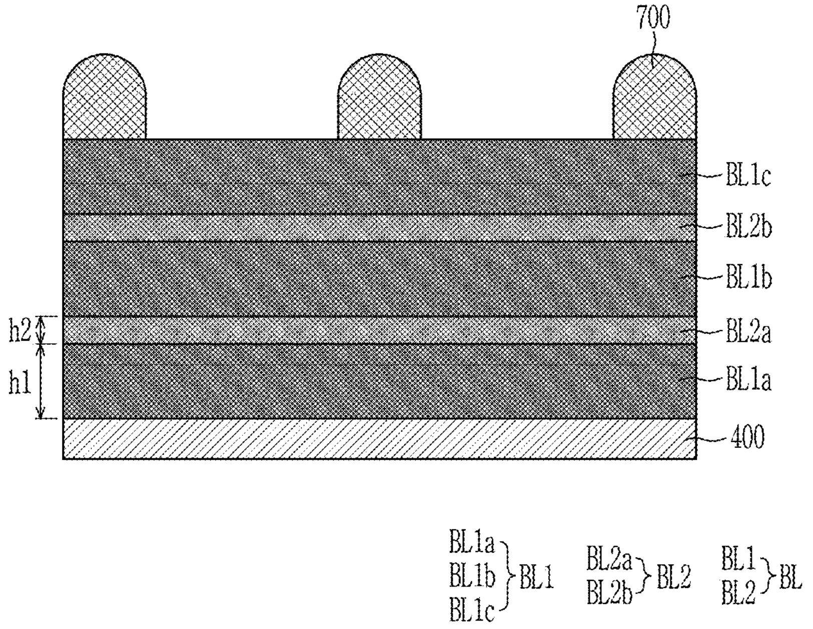

Referring to FIG. 6, to pattern the light blocking material layer in which the light absorption layer BL1 and the compensation layer BL2 are alternately stacked, a pattern of a photoresist 700 is formed using a mask on the light blocking material layer. According to an embodiment of the present disclosure, a hard mask may be further included. The hard mask pattern may be formed by forming a hard mask on a light blocking material layer, forming a photoresist pattern 700 on the hard mask through exposure and development by using a mask, and then etching. For example, an un-patterned photoresist layer may be formed on the light blocking material layer through a process including a spin coating step and a baking step. The un-patterned photoresist layer may be first exposed with a radiation through a photomask, and may then be processed with a typical photoresist process, such as baking and then developing with a developer, to form the photoresist pattern 700.

Figure 7:
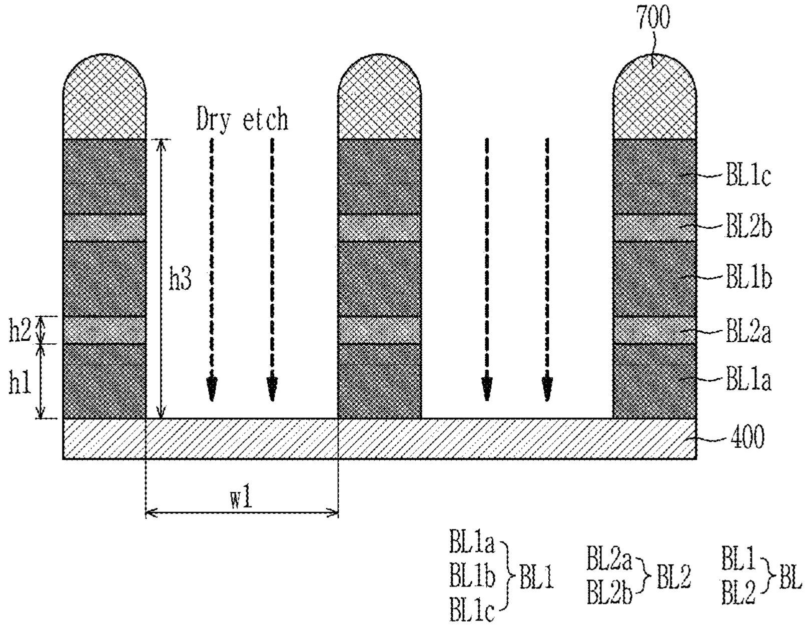

Next, as shown in FIG. 7, a dry etching process may be performed. A portion of the light blocking material layer not overlapping the photoresist pattern 700 is etched, and a portion of the light blocking material layer overlapping the photoresist pattern 700 remains to form the light blocking part BL. For example, RIE may be carried out with the photoresist pattern 700 as an etch mask to remove portions of the light blocking material layer to form the light blocking part BL.

A plurality of light blocking parts BL may be formed by simultaneously etching the light absorption layers BL1*a*, BL1*b*, and BL1*c* and the compensation layers BL2*a* and BL2*b* alternately stacked a plurality of times. The light absorption layer BL1 and the compensation layer BL2 can be etched using the same gas, and may be etched together in one process. For example, the light absorption layer BL1 includes a molybdenum-tantalum oxide (MTO), and the compensation layer BL2 includes molybdenum (Mo), and they may be etched together using a fluorine-based gas.

In the light controller according to an embodiment of the present disclosure, a manufacturing process may be simplified because the light absorption layer and the compensation layer are alternately formed and etched simultaneously without forming an organic barrier. Meanwhile, when a light absorption layer (e.g., MTO layer) is deposited on the organic barrier structure, a step coverage problem in which a molybdenum-tantalum oxide (MTO) layer is thinly formed on the side of the barrier may occur. Accordingly, film damage due to erosion of the molybdenum-tantalum oxide (MTO) layer may occur in a subsequent process, and the light absorption layer formed on the side surface may become thin, resulting in deterioration of light efficiency and a low reflection characteristic. In an embodiment of the present disclosure, since the light blocking part is formed by forming the light absorption layer/compensation layer alternately and then collectively etching the light absorption layer/compensation layer alternately stacked without forming an organic barrier, the above problems may be solved.

Figure 8:
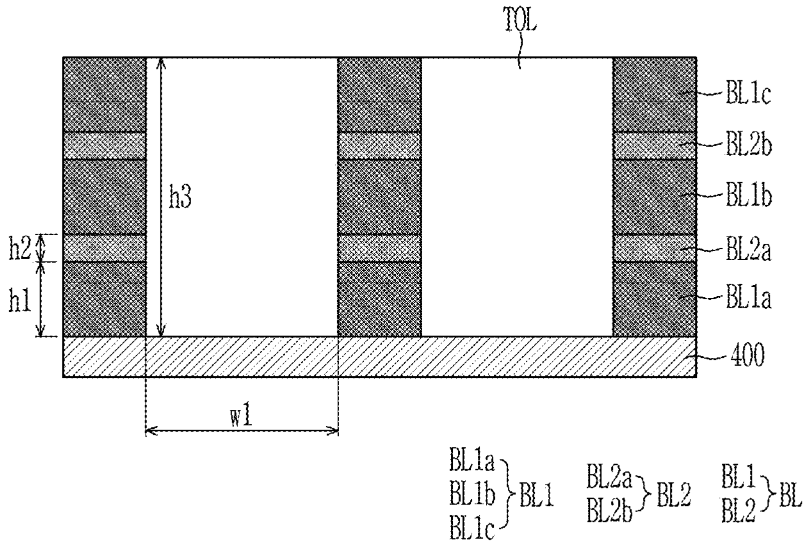

After removing the photoresist pattern 700, referring to FIG. 8, a transparent organic layer TOL is coated to the entire region on the light blocking parts BL. For example, the transparent organic layer TOL may be formed on the light blocking parts BL through a spin coating process. The transparent organic layer TOL coated to the entire region may fill the opening by flowing into the opening between the light blocking parts BL and may flatten the upper surface of the light blocking part BL.

Figure 9:
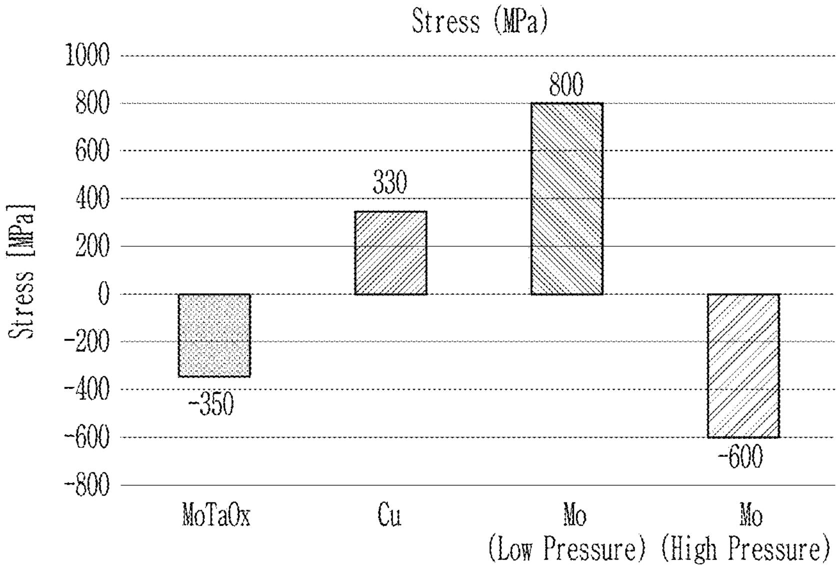
FIG. 9 is a stress distribution graph of some materials.

FIG. 9 is a stress distribution graph of some materials.

Referring to a graph of FIG. 9, a molybdenum-tantalum oxide (MTO) has a stress distribution of 0 MPa to −350 MPa. Copper (Cu) has a stress distribution of 0 MPa to 330 MPa. Molybdenum (Mo) may have a stress distribution of 0 MPa to −600 MPa when the sputtering process is performed at high pressure, and it may have a stress distribution of 0 MPa to 800 MPa when the sputtering process is performed at low pressure. For example, Molybdenum (Mo) may be formed to have a compressive stress, when the sputtering process is performed at high pressure, and it may be formed to have a tensile stress when the sputtering process is performed at low pressure.

As such, the tensile stress or the compressive stress may occur depending on the type of material, and the inherent stress value may vary depending on the process condition for forming the thin film. Particularly, since molybdenum (Mo) may be controlled in various ways from the compressive stress to the tensile stress depending on the sputtering process, it may be applied in various ways as the compensation layer of the light absorption layer with a certain stress.

In an embodiment of the present disclosure, the light absorption layer may be formed using a molybdenum-tantalum oxide (MTO) having the compressive stress, and the compensation layer may be formed using molybdenum (Mo) having the tensile stress of the opposite nature to relieve the compressive stress applied to the light absorption layer. Based on each stress value and the thickness of the thin film, the stress on the substrate may be determined.

When the molybdenum-tantalum oxide (MTO) layer has the compressive stress of about −350 MPa, the thickness of the molybdenum (Mo) layer having the tensile stress of about 700 MPa may be formed at half of the thickness of the molybdenum-tantalum oxide (MTO) layer to offset the entire stress. For example, the total thickness ratio of the molybdenum-tantalum oxide (MTO) layer and the molybdenum (Mo) layer for the stress relief of the light blocking part BL may be about 2:1. Accordingly, the deformation or damage to the substrate may be prevented.

The structure of the light-emitting element disposed under the light controller 10 is described through FIG. 10. FIG. 10 is a cross-sectional view of a display panel according to an embodiment of the present disclosure.

A display panel basically includes a substrate SB, a transistor TR formed on the substrate SB, and a light-emitting element LED connected to the transistor TR. The light-emitting element LED may correspond to a pixel.

The substrate SB may be made of a material such as glass. The substrate SB may be a flexible substrate including a polymer resin such as, for example, polyimide, polyamide, or polyethylene terephthalate. The flexible substrate may be bendable, foldable, or rollable.

A buffer layer BFL may be disposed on top of the substrate SB. The buffer layer BFL may enhance characteristics of a semiconductor layer AL of the transistor TR by blocking an impurity from the substrate SB during the formation of the semiconductor layer AL, and may alleviate the stress of the semiconductor layer AL by flattening the surface of the substrate SB. The buffer layer BFL may include an inorganic insulating material such as, for example, a silicon nitride ($SiN_x$), a silicon oxide ($SiO_x$), or a silicon oxynitride ($SiO_xN_y$), and may be a single layer or multiple layers. The buffer layer BFL may include amorphous silicon (a-Si).

The semiconductor layer AL of the transistor TR may be disposed on the buffer layer BL. The semiconductor layer AL may include a first region, a second region, and a channel region between these regions. The first and second regions may be source/drain regions. The semiconductor layer AL may include any one of amorphous silicon (a-Si), polycrystalline silicon (pc-Si), and an oxide semiconductor. In an embodiment of the present disclosure, the oxide semiconductor may include, for example, a binary compound ($AB_x$), a ternary compound ($AB_xC_y$), or a quaternary compound ($AB_xC_yD_z$) containing an oxide of, for example, indium (In), zinc (Zn), gallium (Ga), tin (Sn), titanium (Ti), aluminum (Al), hafnium (Hf), zirconium (Zr), magnesium (Mg), and/or the like.

A first gate insulating layer GI1 may be disposed on the semiconductor layer AL. The first gate insulating layer GI1 may include an inorganic insulating material such as, for example, a silicon nitride ($SiN_x$), a silicon oxide ($SiO_x$), a silicon oxynitride ($SiO_xN_y$), an aluminum oxide ($AlO_x$), a titanium oxide ($TiO_x$), a tantalum oxide ($TaO_x$), a hafnium oxide ($HfO_x$), or a zinc oxide ($ZnO_x$), and may be a single layer or multiple layers.

A first gate conductive layer that may include a gate electrode GE of the transistor TR, a gate line GL, and a first electrode C1 of a capacitor CS may be disposed on the first gate insulating layer GI1. The first gate conductive layer may include, for example, molybdenum (Mo), aluminum (Al), copper (Cu), titanium (Ti), etc., and may be a single layer or multiple layers.

A second gate insulating layer GI2 may be disposed on the first gate conductive layer. The second gate insulating layer GI2 may include an inorganic insulating material such as, for example, a silicon nitride ($SiN_x$), a silicon oxide ($SiO_x$), or a silicon oxynitride ($SiO_xN_y$), and may be a single layer or multiple layers.

A second gate conductive layer that may include a second electrode C2 of the capacitor CS and the like may be disposed on the second gate insulating layer GI2. The second gate conductive layer may include, for example, molybdenum (Mo), aluminum (Al), copper (Cu), titanium (Ti), or the like, and may be a single layer or multiple layers.

An interlayer insulating layer ILD may be disposed on the second gate insulating layer GI2 and the second gate conductive layer. The interlayer insulating layer ILD may include an inorganic insulating material such as, for example, a silicon nitride ($SiN_x$), a silicon oxide ($SiO_x$), or a silicon oxynitride ($SiO_xN_y$), and may be a single layer or multiple layers.

A first data conductive layer that may include a first electrode SE and a second electrode DE of the transistor TR, a data line DL, etc. may be disposed on the interlayer insulating layer ILD. The first electrode SE and the second electrode DE may be respectively connected to the first region and the second region of the semiconductor layer AL through contact holes of the insulating layers GI1, GI2, and ILD. One of the first electrode SE and the second electrode DE may be a source electrode and the other may be a drain electrode. The first data conductive layer may include, for example, aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), copper (Cu), etc., and may be a single layer or a multilayer.

A first planarization layer VIA1 may be disposed on the first data conductive layer. The first planarization layer VIA1 may be an organic insulating layer. For example, the first planarization layer VIA1 may include an organic insulating material such as, for example, a general-purpose polymer such as poly(methyl methacrylate) or polystyrene, a polymer derivative with a phenolic group, an acryl-based polymer, an imide-based polymer, a polyimide, an acryl-based polymer, or a siloxane-based polymer.

A second data conductive layer, which may include a voltage line VL, a connection line CL, and the like, may be disposed on the first planarization layer VIA1. The voltage line VL may transmit voltages such as, for example, a driving voltage, a common voltage, an initialization voltage, and a reference voltage. The connection line CL may be connected to the second electrode DE of the transistor TR through a contact hole of the first planarization layer VIA1. The second data conductive layer may include, for example, aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), copper (Cu), etc., and may be a single layer or multiple layers.

A second planarization layer VIA2 may be disposed on the second data conductive layer. The second planarization layer VIA2 may be an organic insulating layer. For example, the second planarization layer VIA2 may include an organic insulating material such as, for example, a general-purpose polymer such as poly(methyl methacrylate) or polystyrene, a polymer derivative with a phenolic group, an acryl-based polymer, an imide-based polymer, a polyimide, an acryl-based polymer, or a siloxane-based polymer.

On the second planarization layer VIA2, a first electrode E1 of the light-emitting element LED may be disposed. The first electrode AE may be referred to as a pixel electrode. The first electrode E1 may be connected to the connection line CL through a contact hole of the second planarization layer VIA2. Therefore, the first electrode E1 may be electrically connected to the second electrode DE of the transistor TR and receive a data signal that controls the luminance of the light-emitting element. The transistor TR to which the first electrode E1 is connected may be a driving transistor or a transistor electrically connected to the driving transistor. The first electrode E1 may be formed of a reflective conductive material or a semi-transmissive conductive material, or may be formed of a transparent conductive material. The first electrode E1 may include a transparent conductive material such as, for example, indium tin oxide (ITO), indium gallium zinc oxide (IGZO), or indium zinc oxide (IZO). The first electrode E1 may include a metal or a metal alloy such as, for example, lithium (Li), calcium (Ca), aluminum (Al), silver (Ag), magnesium (Mg), platinum (Pt), palladium (Pd), nickel (Ni), neodymium (Nd), iridium (Ir), chromium (Cr), or gold (Au). In an embodiment of the present disclosure, the first electrode AE of the transistor TR may include a multi-layered structure such as, for example, ITO/Ag/ITO in which indium tin oxide (ITO), silver (Ag), and indium tin oxide (ITO) are sequentially stacked, or ITO/Al/ITO in which indium tin oxide (ITO), aluminum (Al), and indium tin oxide (ITO) are sequentially stacked.

A pixel definition layer 380, which may be an organic insulating layer, may be disposed on the second planarization layer VIA2. The pixel definition layer 380 may be referred to as a barrier rib and may have an opening overlapping the first electrode E1. The pixel definition layer 380 may be a black pixel definition layer formed of an organic material with a black color so that light applied from the outside is not reflected back to the outside, and according to an embodiment of the present disclosure, it may be formed of a transparent organic material. According to an embodiment of the present disclosure, the black pixel definition layer 380 may include an organic material of a negative-type black color, and may include a black color pigment. The pixel definition layer 380 may cover an edge portion of the first electrode E1. The pixel definition layer 380 may prevent an arc or the like from occurring between the first electrode E1 and a second electrode E2 of the light-emitting element LED by increasing a distance between the edge of the first electrode E1 and the second electrode E2 located over the first electrode E1.

Above the first electrode E1, an emission layer EML of the light-emitting element LED may be disposed. In an embodiment of the present disclosure, the emission layer EML may include a fluorescent material or a phosphorescent material. On the first electrode E1, in addition to the emission layer EML, at least one of a hole injection layer, a hole transport layer, an electron transport layer, or an electron injection layer may be disposed.

On the emission layer EML, the second electrode E2 of the light-emitting element LED may be disposed. The second electrode E2 may be formed of a thin layer made of a metal or a metal alloy having a low work function, such as, for example, calcium (Ca), barium (Ba), magnesium (Mg), aluminum (Al), and/or silver (Ag), to have light transmittance. The second electrode E2 may include a transparent conductive oxide such as, for example, indium tin oxide (ITO) or indium zinc oxide (IZO).

The first electrode E1, the emission layer EML, and the second electrode E2 of each pixel may form the light-emitting element LED such as, for example, an organic light emitting element. The first electrode E1 may be an anode of the light-emitting element, and the second electrode E2 may be a cathode of the light-emitting element. The emission layer EML may emit light in response to a potential difference between the first electrode E1 and the second electrode E2. For example, when an anode voltage is applied to the first electrode E1 and a cathode voltage is applied to the second electrode E2, the holes and electrons move to the emission layer EML, such that they combine in the emission layer EML to emit light.

On the second electrode E2, a capping layer CPL may be disposed. The capping layer CPL may increase optical efficiency by adjusting the refractive index. For example, the capping layer CPL may serve to enhance light emitting efficiency by the principle of constructive interference. The capping layer CPL may be disposed to entirely cover the second electrode E2. The capping layer CPL may include an organic insulating material or an inorganic insulating material.

The encapsulation layer 400 may be disposed on the capping layer CPL. The encapsulation layer 400 may encapsulate the light-emitting element LED and prevent penetration of moisture or oxygen from the outside. The encapsulation layer 400 may be a thin film encapsulation layer including at least one inorganic encapsulation film 401 and 403 and at least one organic encapsulation film 402. In an embodiment of the present disclosure, the inorganic encapsulation film 401 or 403 may be formed of, for example, a silicon nitride ($SiN_x$), a silicon oxide ($SiO_x$), a silicon oxynitride ($SiO_xN_y$), an aluminum oxide ($AlO_x$), a titanium oxide ($TiO_x$), a tantalum oxide ($TaO_x$), or a hafnium oxide ($HfO_x$). The organic encapsulation film 402 may be formed of an organic material including, for example, an acrylic resin, an epoxy resin, a phenolic resin, a polyamide resin, or a polyimide resin.

On the encapsulation layer 400, a touch sensor layer TSL including touch electrodes may be disposed. The touch electrodes may have a mesh shape having an opening overlapping the light-emitting element LED.

A light controller 10 may be disposed on the touch sensor layer TSL. On the light controller 10, a cover window to protect the entire front of the display panel may be disposed.

A protective film may be disposed below the substrate SB to protect the display panel. A functional sheet including at least one of, for example, a cushion layer, a heat dissipation sheet, a light blocking sheet, a waterproof tape, or an electromagnetic blocking film may be disposed under the protection film.

Light emitted from the emission layer EML of the display panel may pass through the light controller 10 and the cover window and be recognized by the user. At this time, light emitted upward or downward at a predetermined angle or more with respect to a direction perpendicular to the cover window may be blocked by the light blocking parts BL included in the light controller 10. For example, light emitted from the emission layer EML of the display panel, traveling upward or downward, and incident on the side surfaces of the light blocking parts BL may be absorbed by the light blocking parts BL.

Various effects of the display device including the light controller according to an embodiment of the present disclosure will be described with reference to FIG. 11 to FIG. 13.

Figure 11:
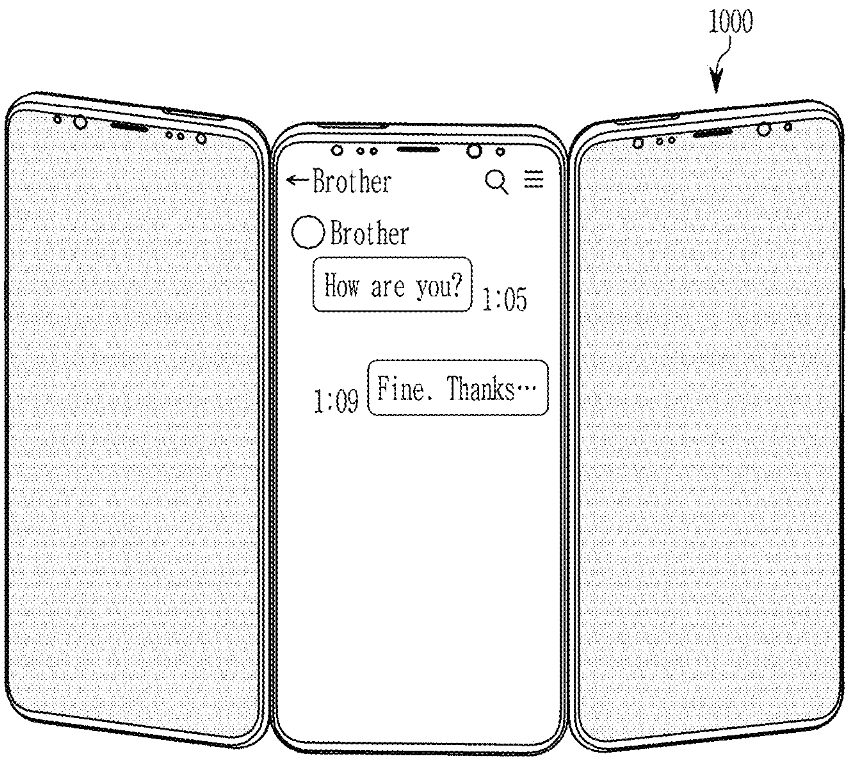
FIG. 11 is a view of a display device according to an embodiment of the present disclosure viewed from various angles.

FIG. 11 is a view of a display device according to an embodiment of the present disclosure viewed from various angles.

Referring to FIG. 11, the display device 1000 according to an embodiment of the present disclosure displays an image to the user in a direction facing the user, and the image may not be viewed at a certain angle or more. Accordingly, the display device 1000 may have a privacy protection function to protect information displayed on the screen from people around in a public place.

Figure 12:
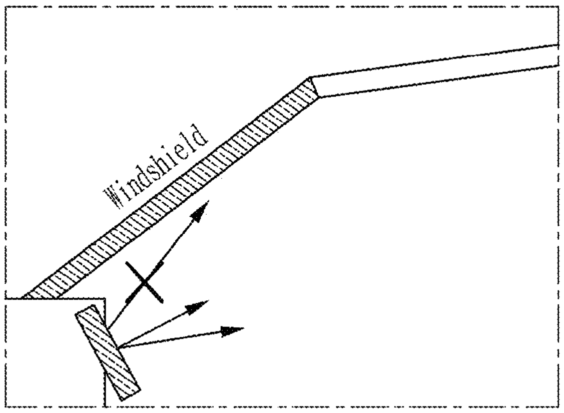
FIG. 12 is a view showing a path of light emitted from a display device according to an embodiment of the present disclosure.
Figure 13:
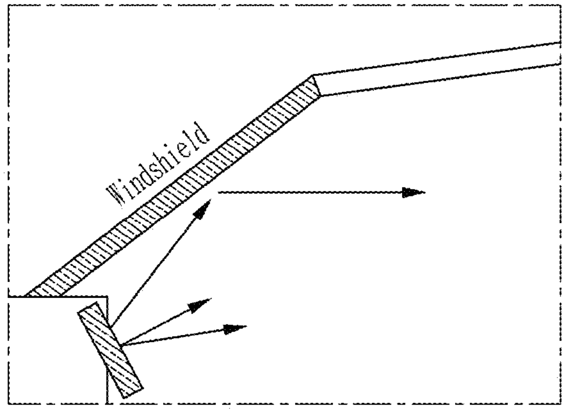
FIG. 13 is a view showing a path of light emitted from a display device according to a comparative example.

FIG. 12 and FIG. 13 are cases where a display device according to an embodiment of the present disclosure is applied to a vehicle. FIG. 12 is a view showing a light path emitted from a display device according to an embodiment of the present disclosure, and FIG. 13 is a view showing a light path emitted from a display device according to a comparative example.

As shown in FIG. 12, in the case of a display device including a light controller, light emitted toward a vehicle window (e.g., a windshield) may be blocked within the display device. Therefore, light emitted from the display device may be prevented from being reflected on the windshield for automobiles. By blocking the light directed from the display device to the windshield for automobiles, reflection images may be prevented and the safety of the driver may be secured.

If such a light controller is not included in a display device, as shown in FIG. 13, as the light emitted from the display device is emitted at various angles, some of the light is emitted toward the windshield for automobiles, and there may be a problem in that it is recognized as a reflected image by the user. Accordingly, the safety of the driver may not be secured.

While this disclosure has been described in connection with what is presently considered to be practical embodiments, it is to be understood that the disclosure is not limited to the disclosed embodiments. On the contrary, it is intended to cover various modifications and equivalent arrangements included within the spirit and scope of the present disclosure as defined by the appended claims.

What is claimed is:

1. A display device comprising:
a substrate;
a light-emitting element disposed on the substrate and including an emission layer; and
a light controller disposed on the light-emitting element,
wherein the light controller includes:
a plurality of light blocking parts extending in a first direction and spaced apart along a second direction crossing the first direction; and
a transparent organic layer disposed between the plurality of light blocking parts,
each of the plurality of light blocking parts includes at least one light absorption layer and at least one compensation layer alternately stacked along a thickness direction of the substrate, and
the at least one light absorption layer has a compressive stress and the at least one compensation layer has a tensile stress.

2. The display device of claim 1, wherein
the at least one light absorption layer is formed of a molybdenum-tantalum oxide, and the at least one compensation layer is formed of molybdenum.

3. The display device of claim 1, wherein
a number of the light absorption layers is greater than a number of the compensation layers.

4. The display device of claim 1, wherein
at least one of an uppermost layer or a lowermost layer of each of the light blocking parts is one light absorption layer of the at least one light absorption layer.

5. The display device of claim 2, wherein
the at least one light absorption layer includes about 2 at % to about 15 at % of tantalum.

6. The display device of claim 1, wherein
a total thickness of the at least one light absorption layer is more than twice that of the at least one compensation layer.

7. The display device of claim 6, wherein
a ratio of the total thickness of the at least one light absorption layer and the total thickness of the at least one compensation layer is about 2:1 to 4:1.

8. The display device of claim 1, wherein
a total thickness of the at least one compensation layer is less than or equal to (a total thickness of the at least one light absorption layer)*(a stress of the at least one light absorption layer/a stress of the at least one compensation layer).

9. The display device of claim 1, further comprising
a touch sensor layer disposed between the light-emitting element and the light controller and including a touch electrode.

10. The display device of claim 1, wherein
the at least one light absorption layer is two or more light absorption layers, and at least one of the two or more light absorption layers has a thickness different from that of an other one of the two or more light absorption layers.

11. A manufacturing method of a display device comprising:
forming a light-emitting element on a substrate;
forming an encapsulation layer covering the light-emitting element;

forming a light blocking material layer by alternately stacking a light absorption layer for absorbing light and a compensation layer for compensating for a stress of the light absorption layer on the encapsulation layer;

forming light blocking parts by dry etching the light blocking material layer; and coating a transparent organic layer filling between the light blocking parts.

12. The manufacturing method of the display device of claim 11, wherein the light absorption layer has a compressive stress, and the compensation layer has a tensile stress.

13. The manufacturing method of the display device of claim 11, wherein the light absorption layer is formed of a molybdenum-tantalum oxide, and the compensation layer is formed of molybdenum.

14. The manufacturing method of the display device of claim 11, wherein at least one of an uppermost layer or a lowermost layer of each of the light blocking parts is the light absorption layer.

15. The manufacturing method of the display device of claim 13, wherein the light absorption layer includes about 2 at % to about 15 at % of tantalum.

16. The manufacturing method of the display device of claim 11, wherein a thickness of the light absorption layer is twice or more than that of the compensation layer.

17. The manufacturing method of the display device of claim 16, wherein a ratio of the thickness of the light absorption layer and the thickness of the compensation layer is about 2:1 to 4:1.

18. The manufacturing method of the display device of claim 11, wherein a thickness of the compensation layer is less than or equal to (a thickness of the light absorption layer)*(the stress of the light absorption layer/a stress of the compensation layer).

19. The manufacturing method of the display device of claim 11, further comprising, after the forming of the encapsulation layer, forming a touch sensor layer including a touch electrode on the encapsulation layer.

20. The manufacturing method of the display device of claim 11, further comprising, after the forming of the light blocking material layer, forming a hard mask pattern on the light blocking material layer.

* * * * *